US009312855B2

(12) United States Patent
Carley (10) Patent No.: US 9,312,855 B2
(45) Date of Patent: Apr. 12, 2016

(54) TOUCH SENSOR TRACKS

(75) Inventor: Carl Carley, Basingstokes (GB)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/347,162

(22) Filed: Jan. 10, 2012

(65) Prior Publication Data

US 2013/0176267 A1    Jul. 11, 2013

(51) Int. Cl.
| | | |
|---|---|---|
| G09G 5/00 | (2006.01) | |
| H03K 17/96 | (2006.01) | |
| G06F 3/044 | (2006.01) | |
| H05K 3/00 | (2006.01) | |
| H05K 1/03 | (2006.01) | |
| H05K 3/10 | (2006.01) | |

(52) U.S. Cl.
CPC ............ *H03K 17/9622* (2013.01); *G06F 3/044* (2013.01); *H05K 3/0032* (2013.01); *G06F 2203/04103* (2013.01); *H03K 2217/960755* (2013.01); *H05K 1/0393* (2013.01); *H05K 3/107* (2013.01); *H05K 2201/0145* (2013.01)

(58) Field of Classification Search
CPC .......... G06F 3/044; G06F 2330/04113; G06F 3/034; G06F 2203/04103; H05K 3/0032; H05K 3/107; H05K 1/0393
USPC ...................... 345/173–178; 178/18.01–19.06
See application file for complete search history.

(56) References Cited

U.S. PATENT DOCUMENTS

| | | | |
|---|---|---|---|
| 5,229,916 A * | 7/1993 | Frankeny et al. ............. | 361/718 |
| 7,663,607 B2 | 2/2010 | Hotelling | |
| 7,864,503 B2 | 1/2011 | Chang | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,217,902 B2 | 7/2012 | Chang | |
| 8,723,824 B2 | 5/2014 | Myers | |
| 2008/0309635 A1 | 12/2008 | Matsuo | |
| 2009/0123661 A1 * | 5/2009 | Wargo et al. .................. | 427/555 |
| 2009/0205879 A1 * | 8/2009 | Halsey, IV et al. ........ | 178/18.06 |
| 2009/0315854 A1 | 12/2009 | Matsuo | |

(Continued)

FOREIGN PATENT DOCUMENTS

WO     WO 2012/129247         9/2012

OTHER PUBLICATIONS

U.S. Appl. No. 61/454,936, filed Mar. 21, 2011, Myers.

(Continued)

*Primary Examiner* — Jennifer Nguyen
(74) *Attorney, Agent, or Firm* — Baker Botts L.L.P.

(57) ABSTRACT

In one embodiment, a method includes receiving a touch sensor substrate associated with a plurality of electrodes and a plurality of connection pads. The plurality of electrodes is configured to detect a touch. The plurality of connection pads are configured to be electrically coupled with a touch controller. The method further includes laser etching a plurality of paths. The method also includes filling the plurality of paths with an electrically conductive material to form a plurality of tracks. Each track is configured to electrically couple at least one connection pad of the plurality of connection pads with at least one electrode of the plurality of electrodes.

20 Claims, 3 Drawing Sheets

(56) References Cited

U.S. PATENT DOCUMENTS

| | | |
|---|---|---|
| 2011/0201153 A1* | 8/2011 | Pagaila et al. ................ 438/107 |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2012/0319966 A1* | 12/2012 | Reynolds ..................... 345/173 |
| 2012/0327016 A1* | 12/2012 | Hristov ........................ 345/174 |
| 2013/0076612 A1 | 3/2013 | Myers |
| 2013/0082970 A1* | 4/2013 | Frey et al. .................... 345/173 |

OTHER PUBLICATIONS

U.S. Appl. No. 61/454,950, filed Mar. 21, 2011, Lynch.
U.S. Appl. No. 61/454,894, filed Mar. 21, 2011, Rothkopf.

* cited by examiner

TOUCH SENSOR TRACKS

TECHNICAL FIELD

This disclosure generally relates to touch sensor tracks

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
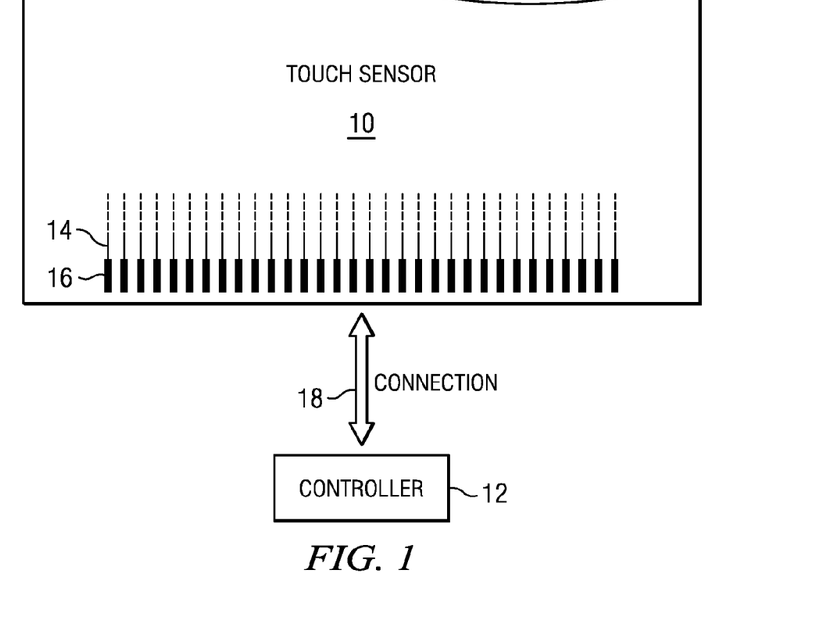
FIG. 1 illustrates an example touch sensor with an example controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, thin line other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 μm or less and a width of approximately 10 μm or less. As another example, one or more portions of the conductive material may be silver or silver-based and similarly have a thickness of approximately 5 μm or less and a width of approximately 10 μm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such as one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may electrically couple the drive or sense electrodes of touch sensor 10 to connection pads 16, also disposed on the substrate of touch sensor 10. Tracks 14 may comprise paths etched in the substrate of touch sensor 10 with a laser. The etched paths may be filled with an electrically conductive material. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). In some embodiments, the space for connection pads 16 may be etched with a laser at the same time the paths for tracks 14 are etched.

Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2:
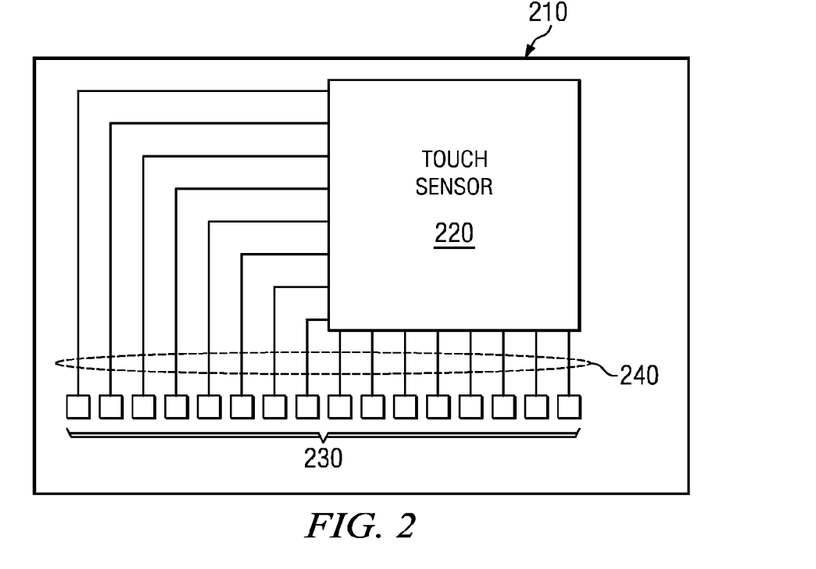
FIG. 2 illustrates an overhead view of an example touch sensor with laser etched tracks connecting the touch sensor with corresponding connection pads.

FIG. 2 illustrates an overhead view of an example touch sensor with laser etched tracks connecting the touch sensor with corresponding connection pads. In the depicted embodiment, sensor substrate 210 has disposed thereon touch sensor 220, connection pads 230, and tracks 240. Connection pads 230 may provide a connection point for a touch-sensor controller. Touch sensor 220 may comprise several electrodes (e.g., drive electrodes and sense electrodes). The electrodes from touch sensor 220 may be connected to connection pads 230 via tracks 240. Tracks 240 may comprise an electrically conductive material. This may allow tracks 220 to electrically connect connection pads 230 to the drive and sense electrodes of touch sensor 220.

Tracks 240 may comprise paths that are etched into sensor substrate 210 via a laser. The pattern of the paths of tracks 240 may be determined by a pattern file. The pattern file may provide a controller with information that the controller can use to specify how the laser is to etch the paths for tracks 240. In some embodiments, a mask may be used along with the laser to etch the paths for tracks 240. Although the depicted embodiment includes a fairly simple pattern, in practice tracks 240 may comprise many different turns in order to navigate around various other components (e.g., a controller, not illustrated) on sensor substrate 210. In some embodiments, after the paths have been formed by the laser, electrically conductive material (e.g., copper, silver, indium-tin oxide, etc.) may be deposited in the paths to form tracks 240. In particular embodiments, after the paths have been formed by the laser a seeding layer material may be used to partly fill the etched paths. Copper plating may then be added to the seeding layer such that the copper is flush with sensor substrate 210.

Depending on the embodiment, contact pads 230 may be etched concurrently with the paths of tracks 240. In certain embodiments, touch sensor substrate 210 may include touch sensor 220 and connection pads 230 prior to the paths of the tracks 240 being formed. In other embodiments, tracks 240 may be formed prior to touch sensor 220 and/or connection pads 230 being added to sensor substrate 210.

Figure 3:
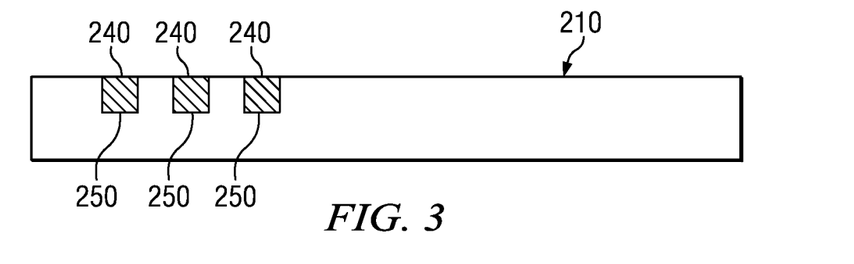
FIG. 3 illustrates a profile view of a touch sensor substrate comprising laser etched tracks.

FIG. 3 illustrates a profile view of a touch sensor substrate comprising laser etched tracks. In the depicted embodiment, the laser etched paths 250 have been filled with an electrically conductive material to form tracks 240. The width and depth of paths 250 may vary depending on operational needs. For example, in some instances, paths 250 may be approximately five micrometers wide and approximately five micrometers deep. In some instances, the paths may be narrower and/or shallower. In some embodiments, the width and/or depth of a path may depend on whether the path is for a drive electrode, a sense electrode, a ground line, or for another type of track.

In the depicted embodiment, tracks 240 are formed in the top surface of sensor substrate 210. This may be consistent with a touch sensor in which the drive and sense electrodes are on the same side of sensor substrate 210 (e.g., in a single-sided touch sensor). This may also be consistent with embodiments in which the drive electrodes and the sense electrodes are on separate substrates. In some embodiments, the drive electrodes may be on one side of sensor substrate 210 and the sense electrodes may be on the opposite side of sensor substrate 210. In such an embodiment, paths 250 may be etched on both sides of sensor substrate 210 in order to accommodate both electrodes. Depending on the embodiment, sensor substrate 210 may be rigid or flexible.

Figure 4:
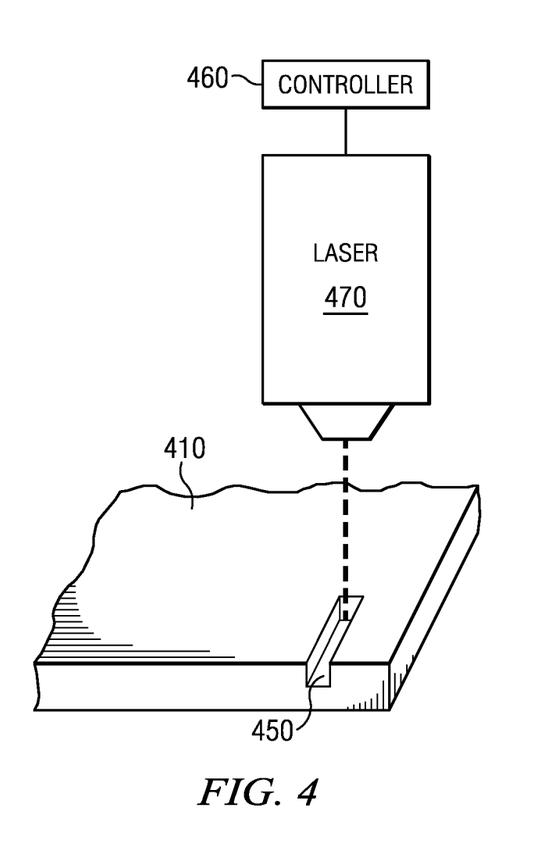
FIG. 4 illustrates a block diagram of a system for laser etching paths into a substrate of a touch sensor.

FIG. 4 illustrates a block diagram of a system for laser etching paths into a substrate of a touch sensor. The depicted system comprises controller 460 and laser 470. While controller 460 is depicted as a separate component from laser 470, in certain embodiments, controller 460 may be a component of laser 470. In the depicted embodiment, controller 460 generates commands or signals that may be used to manipulate laser 470 in order to form path 450 in sensor substrate 410. Path 450 formed by laser 470 may follow a pattern maintained by controller 460. The pattern may be based on a pattern file received by controller 460. The use of the pattern file to control laser 470 may allow for simple design changes or to manufacturer different touch sensors on the same equipment. All that may be necessary is to replace an existing pattern file with a new pattern file. In some embodiments, controller 460 may maintain multiple pattern files concurrently. A suitable or proper pattern file may then be selected when appropriate. In some embodiments, a mask may be used along with laser 470 to form paths 450. The mask may block the light from a laser from reaching certain areas of sensor substrate 410 and allow light from the laser to reach certain areas of sensor substrate 410 to form paths 450. Changing the pattern of paths simply requires changing the pattern of the mask. The ease with which different patterns for path 450 may be implemented may reduce the cost of manufacturing and/or developing touch sensors (e.g., as compared to typical techniques for creating tracks in a substrate in which the tracks are formed via mechanical means).

Laser 470 may include any type of laser suitable for etching a path in the substrate 410. For example, in some embodiments, laser 470 may comprise a 248 nanometer or 193 nanometer excimer or exciplex laser. In some embodiments a motif may be used to focus the laser beam. The type of laser used may depend on the type of substrate of the touch sensor. Laser 470 may etch path 450 to any desired depth and/or width depending on operational needs. Once etched, path 450 may be filled with an electrically conductive material to form a track. When filled with an electrically conductive material, the track for path 450 may be configured to electrically connect a particular electrode of a touch sensor (e.g., a drive electrode or a sense electrode), with a corresponding connection pad. This may allow the track for path 450 to conduct either a drive current from the touch controller (via the corresponding connection pad) to the drive electrode of the touch sensor or to carry the change in capacitance from the sense electrode to the controller (via the corresponding connection pad).

Controller 460 may comprise any hardware, encoded logic, or software stored in a non-transitory computer readable medium necessary to generate signals to control laser 470 based on a pattern file. For example, controller 460 may include one or more interfaces (e.g., USB, Ethernet, Wi-Fi, mouse/keyboard, etc.) appropriate for receiving pattern files. As another example, controller 460 may include one or more processors (e.g., microprocessors, microcontrollers, application specific integrated circuits, field programmable gate arrays, etc.) appropriate for converting a pattern file into commands or signals for manipulating laser 470. As another example, controller 460 may also include one or more non-transitory computer readable mediums (e.g., flash memory, RAM, ROM, hard disk drive, optical disc drive, etc.). The non-transitory computer readable storage medium may store any pattern files received via the interface. The non-transitory computer readable medium may also store any logic or software used by the processor to interpret the pattern file and manipulate laser 470. Although this disclosure describes a particular controller having particular components, this disclosure contemplates any suitable controller having any suitable components.

The system depicted in FIG. 4 is just one example system, other embodiments may include other systems. For example, in some embodiments, an excimer exciplex laser may pass over a mask (e.g., a 1:1 mask on or above the sensor substrate) without any apertures or motifs focusing the laser beam. The pattern of the mask may allow the light from laser to form the paths in the sensor substrate. Once the laser has etched the paths based on mask, the mask may be removed and the paths filled with conductive material. In some embodiments, opposed coordinate motion may be used (e.g., when the mask is larger than the laser beam).

Figure 5:
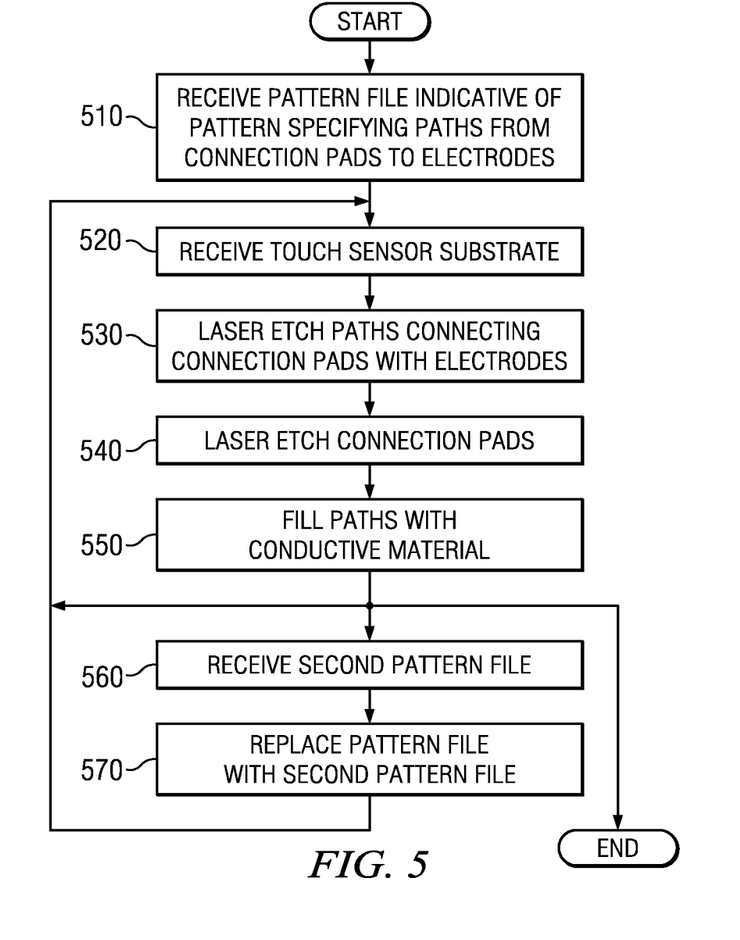
FIG. 5 illustrates a method for etching tracks in a touch sensor substrate.

FIG. 5 illustrates a method for etching tracks in a touch sensor substrate. The method may start at step 510 where a pattern file is received. The pattern file may be indicative of a pattern specifying one or more paths from one or more connection pads to one or more electrodes of a touch sensor. The pattern file may also specify the depth of the paths to be etched in the sensor substrate. In certain embodiments, there may be a one-to-one correlation between an electrode, a connection pad, and a track electrically connecting the two. In some embodiments, the pattern file may be received by a controller configured to manipulate a laser. The laser may be configured to etch the paths in the sensor substrate. The controller may be a separate component, or integrated component, of the laser. The pattern file may be in any suitable format from which the controller may determine the desired pattern for the paths that the laser is to etch into the sensor substrate.

At step 520 a touch sensor substrate is received. The touch sensor substrate may be received from a third party who manufactures the sensor substrate but not the tracks of a touch sensor. In some embodiments, the touch sensor substrate may be received from the same manufacturer that also etches the tracks into the sensor substrate. For example, the manufacturer may use one machine to form the sensor substrate, and then a second machine may receive the sensor substrate to etch the paths for the tracks therein. Depending on the embodiment, the sensor substrate that is received may be rigid or flexible. Also depending on the embodiment, or scenario, the sensor substrate may be in various stages of assembly. For example, the sensor substrate may or may not already include the drive and sense electrodes, the controller for controlling the touch sensor, the connection pads, or any other component of a touch sensor. In some embodiments, one or more of these components may be added to the sensor substrate after the tracks have been formed at step 550.

At step 530 paths are laser etched into the sensor substrate. When filled with an electrically conductive material, at least some of the etched paths will electrically connect the connection pads with the electrodes of the touch sensor. In certain embodiments, for example those in which the substrate does not already include connection pads and/or electrodes, the laser etched tracks may simply travel from where the connection pads and/or electrodes will eventually be formed. The paths may be etched in accordance with the pattern file received at step 510.

At step 540 connection pads are laser etched into the sensor substrate. The connection pads may be etched based on the same pattern file used to etch the tracks at step 530. At step 540, the connection pads may simply comprise an etched space into which the electrically conductive material of a connection pad will be deposited. In some embodiments, the sensor substrate may already have connection pads formed therein. In other embodiments, the connection pads may be added to the sensor substrate after the tracks have been formed. In either scenario, step 540 may be skipped.

At step 550 the laser etched tracks are filled with an electrically conductive material. This may allow electricity to flow between the electrodes of the touch sensor and the connection pads. For example, a track connecting a drive electrode to a connection pad may allow a controller to send a drive current to the drive electrode through the corresponding track. In some embodiments, the etched connection pads may also be filled with an electrically conductive material at step 550. The connection pads may be configured to provide a connection point for a controller with the electrodes via the laser etched tracks.

Once the tracks have been filled with the conductive material, the tracks for that particular touch sensor may be complete. At that point, the method may go in a variety of different directions depending on the scenario. For example, if the tracks that have been formed are for the final touch sensor for a particular manufacturing run, then the method may end after step 550. If the touch sensor for which the tracks have been formed is not the last touch sensor of a manufacturing run, the method may return to step 520 and a new substrate may be received and steps 520 through 550 may be repeated. These steps may be repeated as many times as is necessary to complete the manufacturing run. Once this manufacturing run has been completed the method may then end. In some scenarios, the manufacturer may desire to make a change to the pattern with which the tracks are formed. This change may be based on the manufacturer testing different patterns, or where the manufacturer is producing different types or sizes of touch sensors in a single manufacturing run. In such a scenario, the method continues to step 560

At step 560 a second pattern file is received. The second pattern file may be received in a similar fashion to the pattern file that was received at step 510. The second pattern file may contain similar information as the initial pattern file received at step 510. One difference between the initial pattern file and the second pattern file may be that the second pattern file is associated with a different pattern of paths. At step 570, the second pattern file replaces the initial pattern file that was received at step 510. This effectively changes the path that the laser will etch into the sensor substrate. The method then returns to step 520 and steps 520 through 550 are repeated to form a touch sensor with tracks that conform with the pattern provided in the second pattern file.

The steps illustrated in FIG. 5 are representative of a particular embodiment, other embodiments may include different steps arranged in a different order. For example, in some embodiments the touch sensor substrate may be received before the pattern file is received. For example, based on the type of touch sensor substrate received, the controller for the laser may load a corresponding pattern file from its associated non-transitory computer readable medium. Other modifications may be apparent to one of ordinary skill in the art.

Although this disclosure describes and illustrates particular steps of the method of FIG. 5 as occurring in a particular order, this disclosure contemplates any suitable steps of the method of FIG. 5 occurring in any suitable order. Furthermore, although this disclosure describes and illustrates particular components, devices, or systems carrying out particular steps of the method of FIG. 5, this disclosure contemplates any suitable combination of any suitable components, devices, or systems carrying out any suitable steps of the method of FIG. 5.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method, comprising:
receiving a first pattern file indicative of a first pattern associated with a plurality of tracks, the first pattern specifying, for each track, a path that is to be etched by a laser from a connection pad of a plurality of connection pads associated with a touch sensor substrate to an electrode of a plurality of electrodes associated with the touch sensor substrate, the plurality of electrodes for detecting a touch, the plurality of connection pads configured to be electrically coupled with a touch controller;
laser etching a plurality of paths according to the first pattern indicated by the first pattern file;
depositing a seed layer material to partly fill the plurality of paths; and
filling the plurality of paths with an electrically conductive material to form the plurality of tracks, such that the electrically conductive material is substantially flush with the touch sensor substrate, each track being configured to electrically couple at least one connection pad of the plurality of connection pads with at least one electrode of the plurality of electrodes.

2. The method of claim 1, further comprising:
receiving a second pattern file indicative of a second pattern different than the first pattern and associated with the plurality of tracks, the second pattern specifying, for each track, a path that is to be etched by the laser from a connection pad of the plurality of connection pad to an electrode of the plurality of electrodes; and
replacing the first pattern file with the second pattern file.

3. The method of claim 1, wherein the plurality of electrodes are located on the touch sensor substrate prior to laser etching the plurality of paths.

4. The method of claim 1, wherein the plurality of electrodes are formed on the touch sensor substrate after laser etching the plurality of paths.

5. The method of claim 1, wherein the plurality of tracks are five micrometers wide and five micrometers deep.

6. The method of claim 1, wherein the plurality of connections pads are located on the touch sensor substrate prior to laser etching the plurality of paths.

7. The method of claim 1, further comprising laser etching the connection pads.

8. The method of claim 1, wherein the plurality of electrodes comprise a plurality of drive electrodes and a plurality of sense electrodes.

9. The method of claim 1, wherein the touch sensor substrate comprises a flexible touch sensor substrate.

10. A system, comprising:
a laser configured to laser etch a plurality of paths into a touch sensor substrate that is associated with a plurality of electrodes and a plurality of connection pads, each path being configured to receive an electrically conductive material to form a plurality of tracks configured to electrically couple the connection pads with the electrodes; and
a controller, the controller:
storing a plurality of pattern files, each pattern file indicative of a respective pattern for the plurality of tracks, the pattern specifying a respective path for each of the plurality of tracks; and
configured to:
receive a selection of a first pattern file of the plurality of pattern files; and
manipulate, according to the pattern for the plurality of tracks indicated by the first pattern file, the laser to etch the plurality of paths.

11. The system of claim 10, wherein the controller is further configured to receive the first pattern file indicative of the pattern.

12. The system of claim 11, wherein the controller is further configured to:
receive a selection of a second pattern file of the plurality of pattern files, the second pattern file indicative of a second pattern different than the pattern of the first pattern file;
replace the first pattern file with the second pattern file, and manipulate the laser according to the second pattern of the second pattern file.

13. The system of claim 10, wherein the laser is configured to laser etch the plurality of paths to be five micrometers wide and five micrometers deep.

14. The system of claim 10, wherein the laser is further configured to laser etch the plurality of connection pads.

15. The system of claim 10, wherein the plurality of electrodes comprises a plurality of drive electrodes and a plurality of sense electrodes.

16. The system of claim 10, wherein the laser is configured to laser etch the plurality of paths into a flexible touch sensor substrate that is associated with a plurality of electrodes and a plurality of connection pads.

17. The system of claim 10, wherein the laser comprises an excimer laser.

18. The system of claim 10, wherein the plurality of electrodes are formed on the touch sensor substrate after etching the plurality of paths.

19. An apparatus, comprising:
a touch sensor substrate;
a plurality of drive electrodes formed on the touch sensor substrate;
a plurality of sense electrodes formed on the touch sensor substrate;
a plurality of connection pads configured to be electrically coupled a controller;
a plurality of tracks, each track comprising a laser etched path comprising an electrically conductive material and each track configured to electrically couple at least one connection pad with at least one drive electrode of the plurality of drive electrodes or at least one sense electrode of the plurality of sense electrodes, the electrically conductive material being substantially flush with the touch sensor substrate, each laser etched path patterned according to a pattern indicated by a first pattern file for manipulating a laser to etch the laser etched path according to the pattern and associated with the plurality of tracks, the pattern specifying a path for each of the plurality of tracks.

20. The apparatus of claim 19, wherein:
a first subset of the plurality of tracks are disposed on a first side of the touch sensor substrate; and
a second subset of the plurality of tracks are disposed on a second side of the touch sensor substrate, the second side opposite the first side.

* * * * *